(12) United States Patent
Nakanishi

(10) Patent No.: US 6,876,000 B2
(45) Date of Patent: Apr. 5, 2005

(54) ELECTRO-OPTICAL DEVICE, METHOD OF MANUFACTURING THE SAME, AND ELECTRONIC INSTRUMENT

(75) Inventor: Hayato Nakanishi, Toyuma (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/694,755

(22) Filed: Oct. 29, 2003

(65) Prior Publication Data

US 2004/0135145 A1 Jul. 15, 2004

(30) Foreign Application Priority Data

Dec. 19, 2002 (JP) ........................................ 2002-367950

(51) Int. Cl.[7] .................... H01L 29/04; H01L 31/20; H01L 31/036; H01L 31/0376
(52) U.S. Cl. .......................................... 257/72; 257/59
(58) Field of Search ............................ 257/59, 72, 88

(56) References Cited

U.S. PATENT DOCUMENTS 6,809,338 B2 * 10/2004 Murade ........................ 257/72

2004/0124770 A1 * 7/2004 Hayashi et al. ............. 313/506

FOREIGN PATENT DOCUMENTS

JP B2 2893433 3/1999

* cited by examiner

*Primary Examiner*—Cuong Nguyen
(74) *Attorney, Agent, or Firm*—Oliff & Berridge PLC

(57) ABSTRACT

An electro-optical device includes a substrate; a plurality of unit circuits formed in an operating region of the substrate corresponding to intersecting regions of a plurality of scanning lines and a plurality of data lines, each of the unit circuits including an electro-optical element; at least one peripheral circuit which includes an active element and is formed adjacent to the operating region; and a sealing member which seals the electro-optical elements and includes an attachment section located to overlap the peripheral circuit. The peripheral circuit is one of a scanning line driver circuit, a test circuit and a precharge circuit, the scanning line driver circuit supplying a scanning signal to the unit circuits through the scanning lines, the test circuit testing the unit circuits to determine whether or not each of the unit circuits is defective, and the precharge circuit outputting a precharge signal to the data lines.

13 Claims, 8 Drawing Sheets

ELECTRO-OPTICAL DEVICE, METHOD OF MANUFACTURING THE SAME, AND ELECTRONIC INSTRUMENT

Japanese Patent Application No. 2002-367950 filed on Dec. 19, 2002, is hereby incorporated by reference in its entirety.

BACKGROUND OF THE INVENTION

The present invention relates to an electro-optical device, a method of manufacturing the same, and an electronic instrument.

In an electro-optical device such as an electroluminescent panel, a region for forming a circuit is necessary. Since the electro-optical device includes an element which is easily affected by oxygen or water, a region for forming a sealing member for sealing the element is also necessary. Conventionally, since the region for forming a circuit and the region for attaching a sealing member are necessary, the size of the device is increased.

BRIEF SUMMARY OF THE INVENTION

An electro-optical device according to one aspect of the present invention comprises:

a substrate;

a plurality of unit circuits formed in an operating region of the substrate corresponding to intersecting regions of a plurality of scanning lines and a plurality of data lines, each of the unit circuits including an electro-optical element;

at least one peripheral circuit which includes an active element and is formed adjacent to the operating region; and a sealing member which seals the electro-optical elements and includes an attachment section to the substrate, the attachment section being located to overlap the peripheral circuit, wherein the peripheral circuit is one of a scanning line driver circuit, a test circuit and a precharge circuit, the scanning line driver circuit supplying a scanning signal to the unit circuits through the scanning lines, the test circuit testing the unit circuits to determine whether or not each of the unit circuits is defective, and the precharge circuit outputting a precharge signal to the data lines.

An electronic instrument according to another aspect of the present invention comprises the above electro-optical device.

A method of manufacturing an electro-optical device according to a further aspect of the present invention comprises:

forming a plurality of unit circuits in an operating region of a substrate corresponding to intersecting regions of a plurality of scanning lines and a plurality of data lines, each of the unit circuits including an electro-optical element;

forming at least one peripheral circuit adjacent to the operating region, the peripheral circuit including an active element; and attaching a sealing member to the substrate so that an attachment section of the sealing member overlaps the peripheral circuit, the sealing member sealing the electro-optical elements, wherein the peripheral circuit is one of a scanning line driver circuit, a test circuit and a precharge circuit, the scanning line driver circuit supplying a scanning signal to the unit circuits through the scanning lines, the test circuit testing the unit circuits to determine whether or not each of the unit circuits is defective, and the precharge circuit outputting a precharge signal to the data lines.

DETAILED DESCRIPTION OF THE EMBODIMENT

Figure 1:
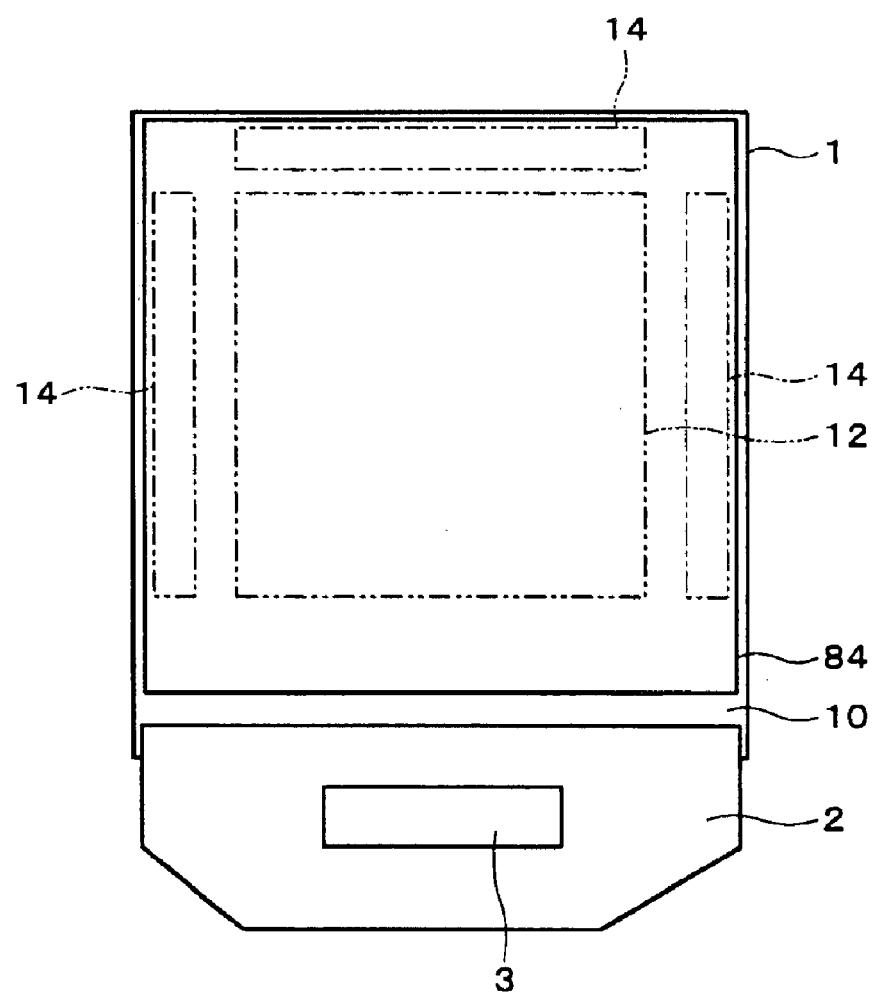
FIG. 1 is illustrative of an electro-optical device according to an embodiment of the present invention.

Embodiments of the present invention may reduce the size of the device.

(1) An electro-optical device according to an embodiment of the present invention comprises:

a substrate;

a plurality of unit circuits formed in an operating region of the substrate corresponding to intersecting regions of a plurality of scanning lines and a plurality of data lines, each of the unit circuits including an electro-optical element;

at least one peripheral circuit which includes an active element and is formed adjacent to the operating region; and a sealing member which seals the electro-optical elements and includes an attachment section to the substrate, the attachment section being located to overlap the peripheral circuit, wherein the peripheral circuit is one of a scanning line driver circuit, a test circuit and a precharge circuit, the scanning line driver circuit supplying a scanning signal to the unit circuits through the scanning lines, the test circuit testing the unit circuits to determine whether or not each of the unit circuits is defective, and the precharge circuit outputting a precharge signal to the data lines. According to this electro-optical device, since the attachment section of the sealing member overlaps the peripheral circuit, the size of the device can be reduced. The term "overlap" means that at least a part of the attachment section overlaps at least a part of the peripheral circuit. The substrate is not limited to a substrate in the shape of a plate, and includes a substrate which is capable of supporting other members even if the substrate has another shape.

(2) This electro-optical device may further comprise a spacer provided adjacent to the peripheral circuit, and the attachment section may be located over the peripheral circuit and the spacer.

(3) In this electro-optical device, the spacer may be formed of the same material as a material for an interconnect which electrically connects the electro-optical element with the peripheral circuit.

(4) In this electro-optical device, the electro-optical element may include one of a plurality of light-emitting layers of different emission colors.

(5) An electronic instrument according to another embodiment of the present invention comprises the above electro-optical device.

(6) A method of manufacturing an electro-optical device according to a further embodiment of the present invention comprises:

forming a plurality of unit circuits in an operating region of a substrate corresponding to intersecting regions of a plurality of scanning lines and a plurality of data lines, each of the unit circuits including an electro-optical element;

forming at least one peripheral circuit adjacent to the operating region, the peripheral circuit including an active element; and attaching a sealing member to the substrate so that an attachment section of the sealing member overlaps the peripheral circuit, the sealing member sealing the electro-optical elements, wherein the peripheral circuit is one of a scanning line driver circuit, a test circuit and a precharge circuit, the scanning line driver circuit supplying a scanning signal to the unit circuits through the scanning lines, the test circuit testing the unit circuits to determine whether or not each of the unit circuits is defective, and the precharge circuit outputting a precharge signal to the data lines. According to this method of manufacturing an electro-optical device, since the attachment section of the sealing member is allowed to overlap the peripheral circuit, the size of the device can be reduced. The term "overlap" means that at least a part of the attachment section overlaps at least a part of the peripheral circuit. The substrate is not limited to a substrate in the shape of a plate, and includes a substrate which is capable of supporting other members even if the substrate has another shape.

The embodiments of the present invention are described below with reference to the drawings.

Figure 2:
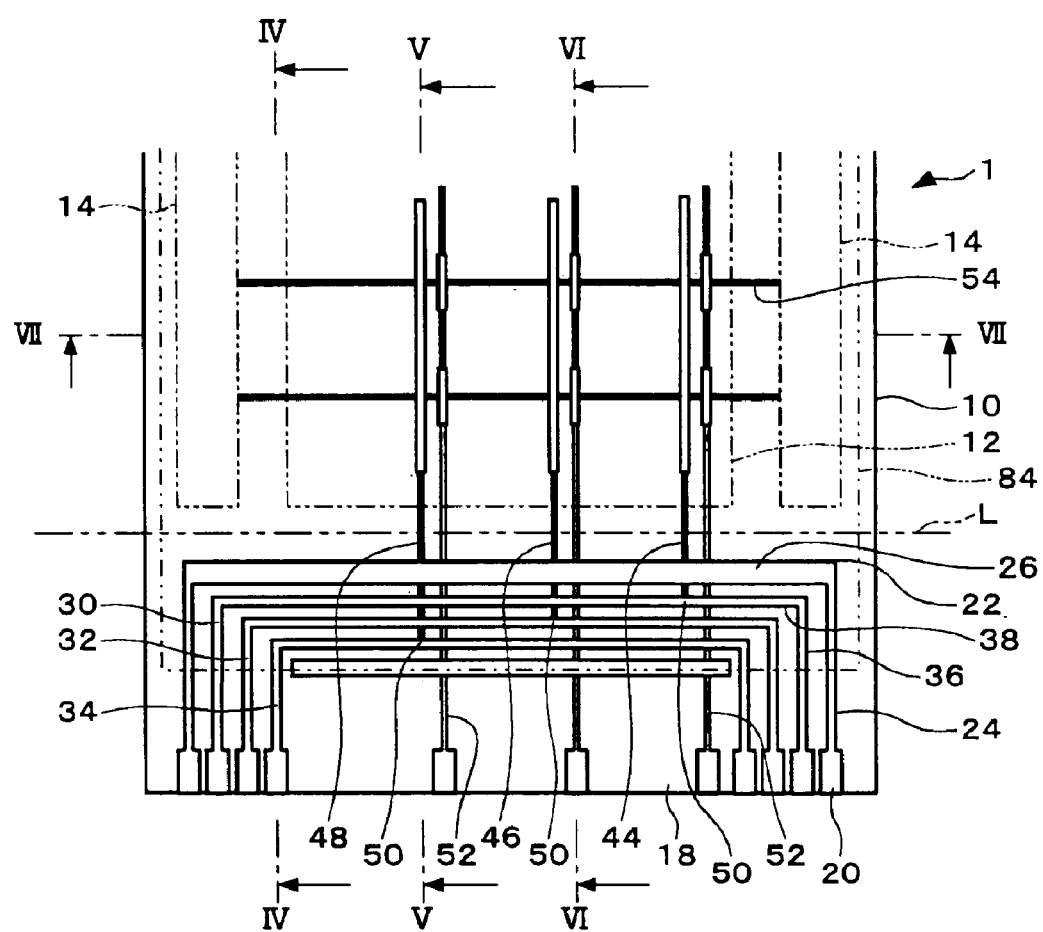
FIG. 2 describes details of an electro-optical device according to an embodiment of the present invention.

FIG. 1 is illustrative of an electro-optical device according to an embodiment of the present invention. FIG. 2 shows details of the electro-optical device. An electro-optical device 1 may be an electro-optical device such as a display device (display panel, for example) or a storage device. The electro-optical device 1 shown in FIG. 1 is an organic electroluminescent (EL) device (organic EL panel, for example). A substrate (flexible substrate, for example) 2 is attached to and electrically connected with the electro-optical device 1. The substrate 2 may be attached to and electrically connected with the electro-optical device 1 by using an anisotropic conductive material such as an anisotropic conductive film or anisotropic conductive paste. The electrical connection includes the case where the substrate 2 is in contact with the electro-optical device 1. This also applies to the following description. The substrate 2 is an interconnect substrate. An interconnect pattern and terminals (not shown) are formed on the substrate 2. An integrated circuit chip (or semiconductor chip) 3 is mounted on the substrate 2. The integrated circuit chip 3 may include a power supply circuit, a control circuit, and the like. The integrated circuit chip 3 may be mounted by applying tape automated bonding (TAB) or Chip on Film (COF). The package form may be that of a tape carrier package (TCP). The electro-optical device 1 including the substrate 2 on which the integrated circuit chip 3 is mounted may be referred to as an electronic module (display module such as a liquid crystal module or an EL module, for example).

The electro-optical device 1 includes a substrate 10. The substrate 10 may be a rigid substrate (glass substrate or silicon substrate, for example) or a flexible substrate (film substrate, for example). The substrate 10 may have light transmitting properties or light shielding properties. In the case of a bottom-emission (or back-emission) type display device (organic EL panel, for example), the substrate 10 having light transmitting properties may be used, and light may be collected from the side of the substrate 10. In the case of a top-emission type organic EL panel, the substrate 10 having light shielding properties may be used. The substrate 10 is not limited to a substrate in the shape of a plate. The substrate 10 includes a substrate which is capable of supporting other members even if the substrate is of another shape.

The substrate 10 includes an operating region (display region, for example) 12. At least one peripheral circuit (scanning line driver circuit, for example) 14 may be formed on the substrate 10. The peripheral circuit 14 may be formed adjacent to the operating region 12. A pair of the peripheral circuits 14 may be formed with the operating region 12 interposed therebetween. At least three peripheral circuits 14 may be formed to surround the operating region 12. The peripheral circuit 14 includes an active element 88 (see FIG. 7). The active element 88 has active functions such as amplification of an input signal, control, conversion, storage, and various types of processing. The active element 88 may be a transistor (MOS transistor, for example). The active element 88 excludes a passive element such as a resistor and a capacitor. The peripheral circuit 14 may include a passive element. The active element 88 may be formed of a polysilicon thin film, and may further include a metal interconnect.

The peripheral circuit 14 may be a scanning line driver circuit which supplies a scanning signal to unit circuits including an electro-optical element 60 through a plurality of scanning lines (interconnects 54, for example). The peripheral circuit 14 may be a test circuit for testing the unit circuit including the electro-optical element 60 to determine whether or not each of the unit circuit is defective, or testing whether or not the operation (display operation, for example) in the operating region 12 is normally performed. The peripheral circuit 14 may be a precharge circuit for increasing the operation speed (display speed) in the operating region 12, or outputting a precharge signal (signal which is charged in advance as a part of a signal (voltage or current), for example) to a plurality of data lines (interconnects 52, for example). Each of a pair of the peripheral circuits 14 between which the operating region 12 is interposed may be the scanning line driver circuits, and at least the remaining one peripheral circuit 14 may be the test circuit or the precharge circuit.

A plurality of external terminals 20 may be formed on the substrate 10. The external terminals 20 may be formed along one side of the substrate 10. The external terminals 20 are formed in an end region 18. The end region 18 is a region separated from the operating region 12 by a straight line L which passes outside the operating region 12 (see FIG. 2).

The end region 18 is a part of a peripheral region of the substrate 10. The definition for the end region also applies to the following description. The operating region 12 may be the center region of the substrate 10 (region excluding the peripheral region).

At least one side interconnect (cathode line, for example) 22 may be formed on the substrate 10. The side interconnect 22 may be formed in the end region (end region in which the external terminals 20 are formed, for example) 18. The side interconnect 22 may be electrically connected with at least two of the external terminals 20. The side interconnect 22 may include a first section 24 which extends from the external terminal 20 in the direction toward the operating region 12. The side interconnect 22 may include a second section 26 which is bent from the first section 24 and extends in the direction of the width of the operating region 12. The second section 26 may be electrically connected with a conductive section 74 (see FIG. 4).

One or more common interconnects (common anode lines, for example) 30, 32, and 34 may be formed on the substrate 10. The common interconnects 30, 32, and 34 may be formed in the end region 18 (end region in which the side interconnect 22 is formed or end region in which the external terminals 20 are formed, for example). At least one of the common interconnects 30, 32, and 34 may be electrically connected with at least two of the external terminals 20. At least one of the common interconnects 30, 32, and 34 may include a first section 36 which extends from the external terminal 20 in the direction toward the operating region 12. At least one of the common interconnects 30, 32, and 34 may include a second section 38 which is bent from the first section 36 and extends in the direction of the width of the operating region 12. The first section 36 of one of the common interconnects 30, 32, and 34 (common interconnect 30, for example) may be disposed outside the first section 36 of one of the remaining common interconnects 30, 32, and 34 (common interconnect 32 or 34, for example) (location close to the edge of the substrate 10). One of the common interconnects 30, 32, and 34 (common interconnect 30 (second section 38 of the common interconnect 30 in more detail), for example) may be disposed at a location closer to the operating region 12 than one of the remaining common interconnects 30, 32, and 34 (common interconnect 32 or 34 (second section 38 of the common interconnect 32 or 34 in more detail), for example).

The common interconnects 30, 32, and 34 may be electrically connected with a plurality of interconnects 44, 46, and 48 (see FIG. 2). The number of common interconnects 30, 32, and 34 (three, for example) may be smaller than the number of interconnects 44, 46, and 48 (3×n(n=2, 3, 4 . . . ), for example). One group of each of the interconnects 44, 46, and 48 may be electrically connected with each of the common interconnects 30, 32, and 34.

The side interconnect 22 (second section 26 of the side interconnect 22, for example) may be disposed at a location closer to the operating region 12 than the common interconnects 30, 32, and 34 (second sections 38 of the common interconnects 30, 32, and 34, for example). The side interconnect 22 may be formed outside the common interconnects 30, 32, and 34, or to surround the common interconnects 30, 32, and 34. In more detail, the first section 24 of the side interconnect 22 may be formed outside the first sections 36 of each of the common interconnects 30, 32, and 34 (location close to the edge of the substrate 10).

Figure 3:
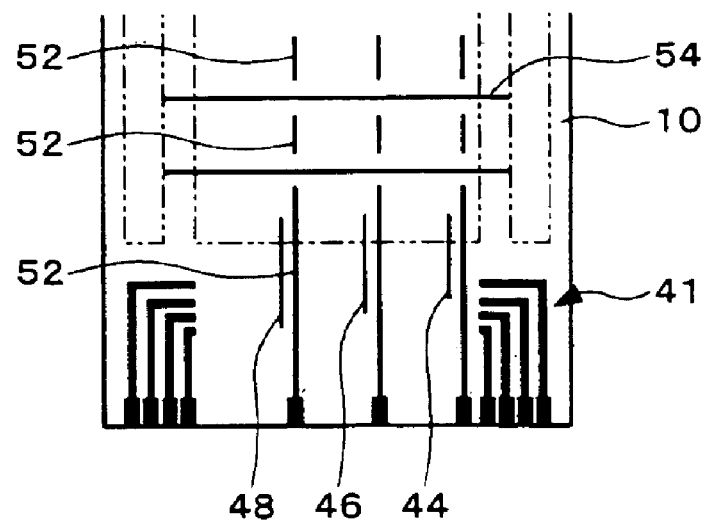
FIGS. 3A to 3C shows conductive patterns in layers in the order from the bottom layer to the top layer.
Figure 3:
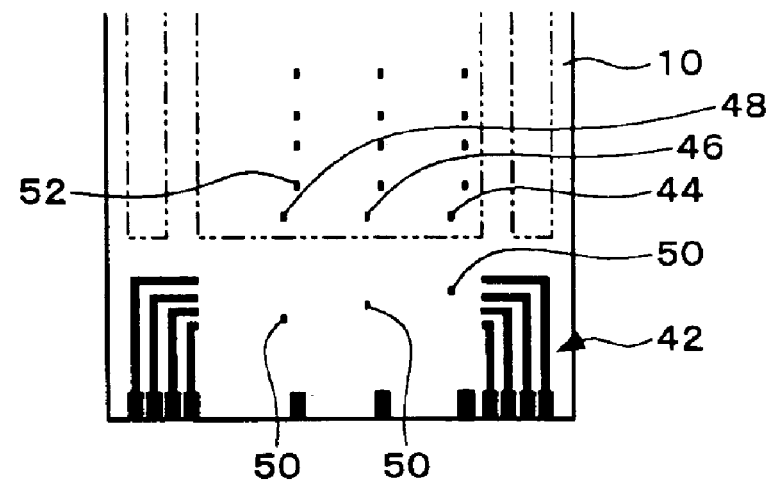
Figure 3:
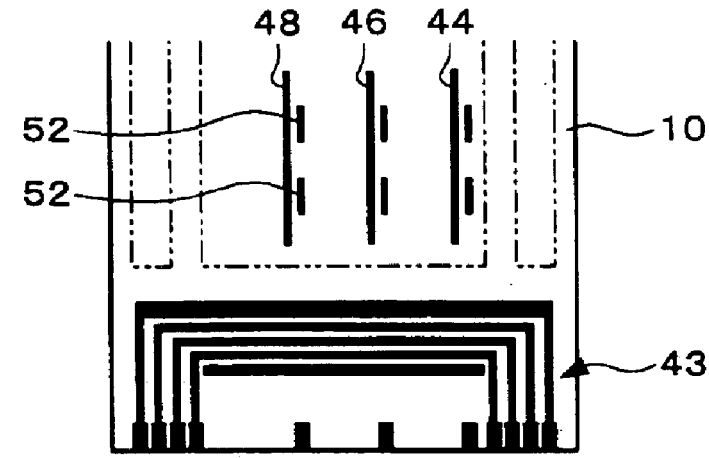
Figure 4:
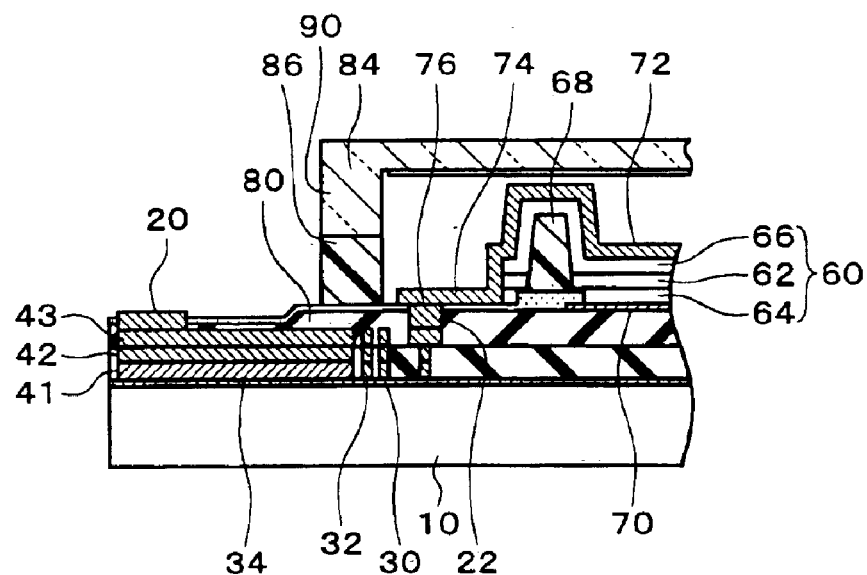
FIG. 4 is a cross-sectional view along the line IV—IV shown in FIG. 2.

The electro-optical device 1 (substrate 10, for example) has a multilayer structure including a plurality of layers of conductive patterns. FIGS. 3A to 3C show conductive patterns in the layers in the order from the bottom to the top. FIG. 4 is a cross-sectional view along the line IV—IV shown in FIG. 2.

The side interconnect 22 includes a stacked section of at least two layers of the conductive patterns. As shown in FIG. 4, at least a part of the side interconnect 22 is formed by a stacked section of a part of a conductive pattern 41 (see FIG. 3A), a part of a conductive pattern 42 (see FIG. 3B) formed on the conductive pattern 41, and a part of a conductive pattern 43 (see FIG. 3C) formed on the conductive pattern 42, for example. This enables at least a part of the side interconnect 22 to be formed thickly, whereby electrical resistance can be reduced. This also applies to at least either the external terminal 20 or the common interconnects 30, 32, and 34.

Figure 5:
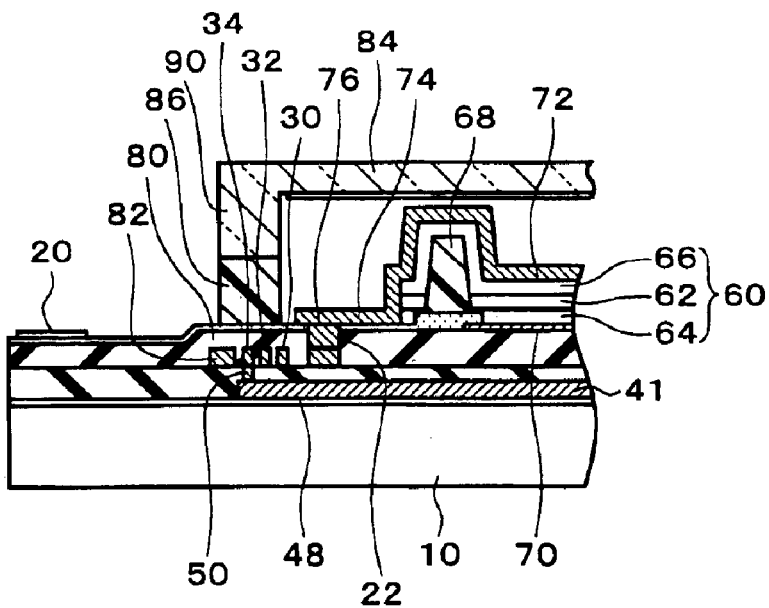
FIG. 5 is a cross-sectional view along the line V—V shown in FIG. 2.

FIG. 5 is a cross-sectional view along the line V—V shown in FIG. 2. The interconnects (anode lines, for example) 44, 46, and 48 electrically connected with the common interconnects 30, 32, and 34 are formed on the substrate 10. Each of the interconnects 44, 46, and 48 is electrically connected with the second section 38 of one of the common interconnects 30, 32, and 34. In a matrix display device which includes pixels arranged in the shape of a matrix, the number of interconnects 44, 46, and 48 may be the same as the number of columns of the pixels. Each of the interconnects 44, 46, and 48 may be formed by a part of at least two layers of the conductive patterns. For example, the interconnects 44, 46, and 48 may be formed by electrically connecting a part of the conductive pattern 41 (see FIG. 3A) with a part of the conductive pattern 42 (see FIG. 3B) formed on the conductive pattern 41, and electrically connecting a part of the conductive pattern 42 with a part of the conductive pattern 43 (see FIG. 3C) formed on the conductive pattern 42.

Each of the common interconnects 30, 32, and 34 is electrically connected with a group of one of the interconnects 44, 46, and 48, and is not electrically connected with the remaining groups. For example, the interconnects 44 (first group) may be electrically connected with the common interconnect 30, the interconnects 46 (second group) may be electrically connected with the common interconnect 32, and the interconnects 48 (third group) may be electrically connected with the common interconnect 34. In this case, the common interconnect 30 is not electrically connected with the interconnects 46 and 48 (second and third groups), the common interconnect 32 is not electrically connected with the interconnects 44 and 48 (first and third groups), and the common interconnect 34 is not electrically connected with the interconnects 44 and 46 (first and second groups).

The interconnects 44, 46, and 48 and the common interconnects 30, 32, and 34 may be disposed to intersect. In this case, a contact section is formed between the overlapping sections to be electrically connected, and an insulator is provided between the overlapping sections not to be electrically connected. For example, first contact sections 50 which electrically connect the interconnects 44, 46, and 48 with the common interconnects 30, 32, and 34 may be formed by a part of the conductive pattern 42 shown in FIG. 3B. In this case, the overlapping sections of the interconnects 44, 46, and 48 and the common interconnects 30, 32, and 34 may be formed by sections of the conductive patterns 41 and 43 (see FIGS. 3A and 3C) located in the layers differing from the conductive pattern 42 (upper and lower layers adjacent to the conductive pattern 42, for example). In the present embodiment, the interconnects 44, 46, and 48 are formed to pass under the common interconnects 30, 32, and 34. The first contact sections 50 between each of the common interconnects 30, 32, and 34 and one of the interconnects 44, 46, and 48 are located in the end region 18 (end region in which the external terminals 20 are formed, for example).

The interconnects 44, 46, and 48 may be disposed to intersect the side interconnect 22. In this case, an insulator is provided between the overlapping sections. For example, the overlapping sections of the interconnects 44, 46, and 48 and the side interconnect 22 may be formed by sections of the conductive patterns 41 and 43 (see FIGS. 3A and 3C) located in the layers between which stacked layers or a single layer is interposed. In the present embodiment, the interconnects 44, 46, and 48 are formed to pass under the side interconnect 22. This allows capacitors to be formed by the interconnects 44, 46, and 48, the insulators, and the side interconnect 22, whereby a rapid voltage drop of the interconnects 44, 46, and 48 can be prevented.

Figure 6:
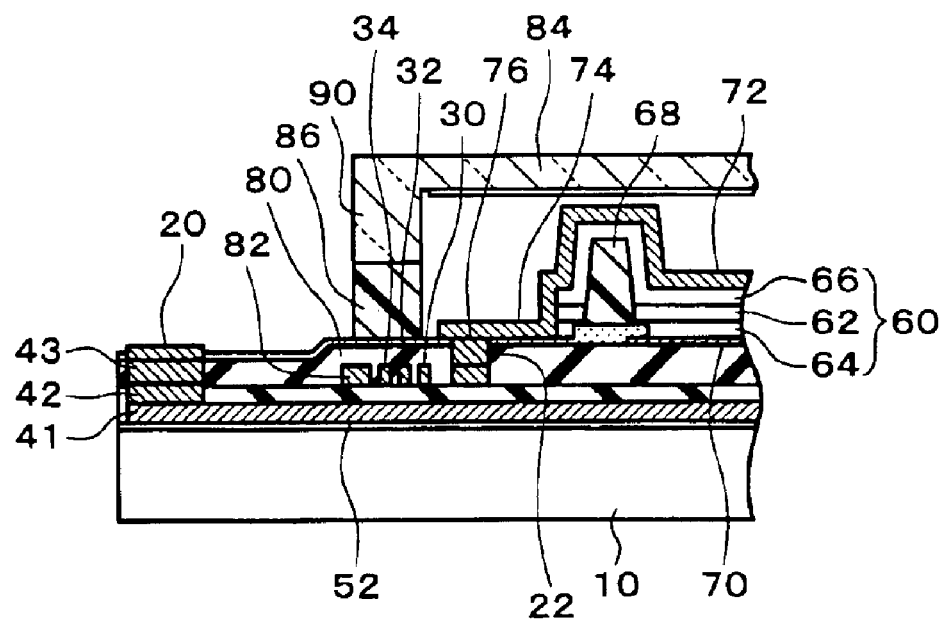
FIG. 6 is a cross-sectional view along the line VI—VI shown in FIG. 2.

FIG. 6 is a cross-sectional view along the line VI—VI shown in FIG. 2. A plurality of interconnects (data lines, for example) 52 are formed on the substrate 10. The interconnect 52 may be formed by a part of at least two layers of the conductive patterns. The interconnect 52 may be formed by electrically connecting a part of the conductive pattern 41 (see FIG. 3A) with a part of the conductive pattern 42 (see FIG. 3B) formed on the conductive pattern 41, and electrically connecting a part of the conductive pattern 42 with a part of the conductive pattern 43 (see FIG. 3C) formed on the conductive pattern 42, for example.

The interconnect 52 may be disposed to intersect the side interconnect 22 and the common interconnects 30, 32, and 34. In this case, an insulator is provided between the overlapping sections. For example, the overlapping sections of the interconnects 52 and the side interconnect 22 and the overlapping sections of the interconnects 52 and the common interconnects 30, 32, and 34 may be formed by sections of the conductive patterns 41 and 43 (see FIGS. 3A and 3C) located in the layers between which stacked layers or a single layer is interposed. In the present embodiment, the interconnect 52 is formed to pass under the side interconnect 22 and the common interconnects 30, 32, and 34. A capacitor may not be formed between the interconnect 52 and the side interconnect 22 (or common interconnects 30, 32, and 34), or the influence of the capacitor may be reduced by forming the interconnect 52 at a distance from the side interconnect 22 (or common interconnects 30, 32, and 34). This enables the capacitance impedance for a signal which flows through the interconnect 52 to be reduced.

A plurality of interconnects (scanning lines, for example) 54 are formed on the substrate 10. The interconnect 54 electrically connects the peripheral circuit (scanning line driver circuit, for example) 14 with the electro-optical element 60. The peripheral circuits 14 may be electrically connected with each end of the interconnect 54. The matrix regions may be partitioned by the interconnects 54 and the interconnects 44, 46, 48, and 52. The interconnect 54 may be disposed to intersect the interconnects 44, 46, 48, and 52. In this case, an insulator is provided between the overlapping sections. For example, the overlapping sections of the interconnects 54 and the interconnects 44, 46, 48, and 52 may be formed by sections of the conductive patterns 41 and 43 (see FIGS. 3A and 3C) located in the layers between which stacked layers or a single layer is interposed. In the present embodiment, the interconnect 54 is formed to pass under the interconnects 44, 46, 48, and 52.

A plurality of the electro-optical elements 60 are provided on the substrate 10. A region in which the electro-optical elements 60 are provided is the operating region 12. The electro-optical elements 60 are provided corresponding to the intersecting regions of a plurality of scanning lines (interconnects 54, for example) and a plurality of data lines (interconnects 52, for example). The electro-optical elements 60 include a plurality of light-emitting layers 62 of a plurality of emission colors (red, green, and blue, for example). Each of the electro-optical elements 60 includes the light-emitting layer 62 of one of the emission colors. A material for the light-emitting layer 62 may be a polymer material, a low-molecular-weight material, or a material in which these materials are used in combination. The light-emitting layer 62 emits light when current flows through the light-emitting layer 62. The luminous efficiency of the light-emitting layers 62 may differ corresponding to the emission colors. One group of the interconnects 44, 46 or 48 electrically connected with the single common interconnect 30, 32, or 34 corresponds to (is electrically connected with) the light-emitting layers 62 of the same emission color.

The electro-optical element 60 may include at least one of first and second buffer layers 64 and 66. The first buffer layer 64 may be a hole injection layer which stabilizes injection of holes into the light-emitting layer 62, or may include a hole injection layer. The first buffer layer 64 may include a hole transport layer. The hole transport layer may be formed between the light-emitting layer 62 and the hole injection layer. The second buffer layer 66 may be an electron injection layer which stabilizes injection of electrons into the light-emitting layer 62, or may include an electron injection layer. The second buffer layer 66 may include an electron transport layer. The electron transport layer may be formed between the light-emitting layer 62 and the electron injection layer. The adjacent light-emitting layers 62 are partitioned (electrically insulated) by a bank 68.

A plurality of first electrodes 70 are formed on the substrate 10. Each of the first electrodes 70 supplies electrical energy to one of the electro-optical elements 60. The first electrode 70 may be in contact with the electro-optical element 60 (first buffer layer 64 (hole injection layer), for example). Each of the first electrodes 70 is electrically connected with one of the interconnects 44, 46, and 48. Each of the interconnects 44, 46, and 48 may be electrically connected with one group of the first electrodes 70.

At least one second electrode 72 is formed on the substrate 10. The second electrode 72 supplies electrical energy to the electro-optical element 60. The second electrode 72 may be in contact with the electro-optical element 60 (second buffer layer 66 (electron injection layer), for example). The second electrode 72 has a section which faces the first electrode 70. The second electrode 72 may be disposed over the first electrode 70.

The second electrode 72 is electrically connected with the conductive section 74. The conductive section 74 may be formed so as not to face the first electrode 70. The second electrode 72 and the conductive section 74 may be integrally formed. The conductive section 74 is electrically connected with the side interconnect 22 (second section 26 of the side interconnect 22, for example). A second contact section 76 between the conductive section 74 and the side interconnect 22 may be located in the end region 18 (end region in which the first contact sections 50 are formed or end region in which the external terminals 20 are formed, for example). In the case where the conductive section 74 is in contact with the side interconnect 22, the contact section between the conductive section 74 and the side interconnect 22 is the second contact section 76. The second contact section 76 may extend in the direction of the width of the operating region 12. For example, the second contact section 76 may be formed to have a length equal to or greater than the interval between the first electrodes 70 located on each end in the direction of the width of the operating region 12. The electrical resistance between the conductive section 74 and the side interconnect 22 can be reduced by increasing the length of the second contact section 76. As a result, electrons smoothly flow from the side interconnect 22 to the second electrode 72.

A covering layer 80 is formed on the substrate 10 so as to cover the common interconnects 30, 32, and 34. The covering layer 80 may be formed of a single layer or a plurality of layers. The covering layer 80 may be formed of an electrically insulating material. At least the surface of the covering layer 80 may be formed of an oxide or a nitride. The side interconnect 22 (at least the second section 26 of the side interconnect 22) is exposed from the covering layer 80.

As shown in FIGS. 5 and 6, a spacer 82 is formed at a location adjacent to the common interconnects 30, 32, and 34 (location at a distance from the operating region 12 or location close to the edge of the substrate 10, for example). The spacer 82 may be a dummy interconnect formed of the same material as the material for at least one of the common interconnects 30, 32, and 34, the side interconnect 22, and the interconnects 44, 46, 48, and 52. The spacer 82 is formed under the covering layer 80. The height of the surface of the covering layer 80 is increased in the region adjacent to the common interconnects 30, 32, and 34 by forming the spacer 82. The difference in height of the surface of the covering layer 80 may be reduced or eliminated between the region over the common interconnects 30, 32, and 34 and the region over the spacer 82 by forming the spacer 82. The degree of inclination or unevenness of the surface of the covering layer 80 may be reduced or the surface of the covering layer 80 may be made flat from the region over the common interconnects 30, 32, and 34 to the region over the spacer 82.

Figure 7:
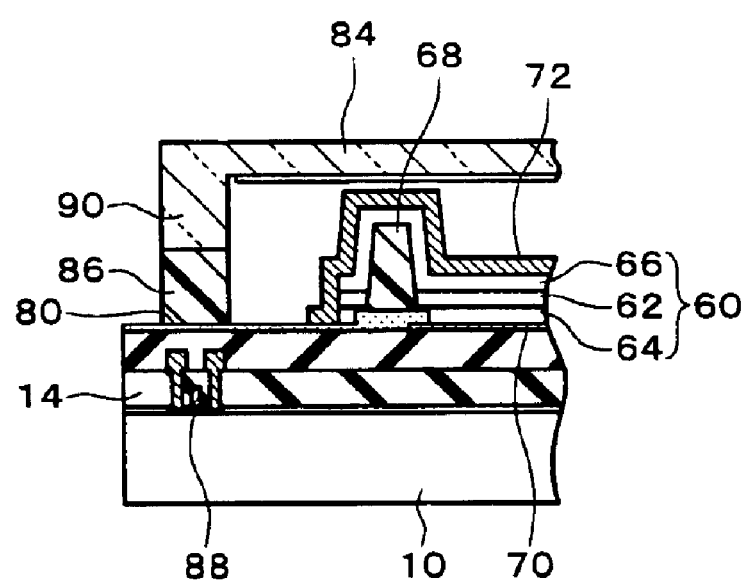
FIG. 7 is a cross-sectional view along the line VII—VII shown in FIG. 2.

A sealing member 84 for the electro-optical element 60 is formed on the substrate 10. In the case where at least a part of the electro-optical element 60 easily deteriorates due to water, oxygen, or the like, the electro-optical element 60 can be protected by the sealing member 84. The sealing member 84 includes an attachment section 90 for the substrate 10. FIG. 7 is a cross-sectional view along the line VII—VII shown in FIG. 2. As shown in FIG. 7, the attachment section 90 is located to overlap the peripheral circuit 14. The term "overlap" means that at least a part of the attachment section 90 overlaps at least a part of the peripheral circuit 14. The attachment section 90 may overlap all the peripheral circuits 14. The attachment section 90 may overlap the peripheral circuits 14 excluding at least one peripheral circuit 14. As shown in FIG. 7, the entire area of one peripheral circuit 14 may be disposed inside the region of the attachment section 90. According to the present embodiment, since the attachment section 90 of the sealing member 84 overlaps the peripheral circuit 14, the size of the device can be reduced.

Figure 8:
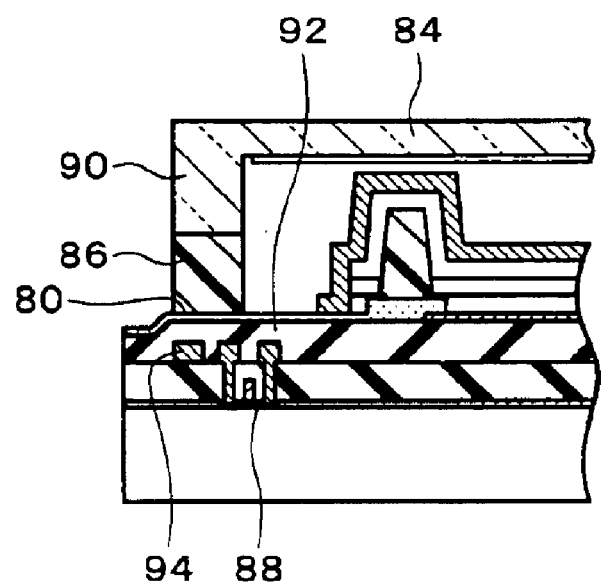
FIG. 8 is illustrative of an electro-optical device according to a modification of an embodiment of the present invention.
Figure 9:
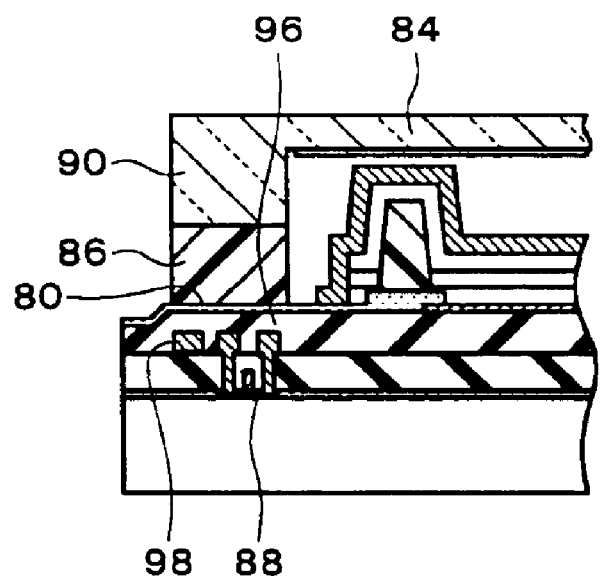
FIG. 9 is illustrative of an electro-optical device according to another modification of an embodiment of the present invention.

FIGS. 8 and 9 are illustrative of modifications of the present embodiment. In FIG. 8, only a part of a peripheral circuit 92 is disposed inside the region of the attachment section 90. In this case, a spacer 94 may be formed at a location adjacent to the peripheral circuit 92. The attachment section 90 may be located over the peripheral circuit 92 and the spacer 92. The height of the surface of the covering layer 80 is increased in the region adjacent to the peripheral circuit 92 by forming the spacer 94. The difference in height of the surface of the covering layer 80 may be reduced or eliminated between the region over the peripheral circuit 92 and the region over the spacer 94 by forming the spacer 94. The degree of inclination or unevenness of the surface of the covering layer 80 may be reduced or the surface of the covering layer 80 may be made flat from the region over the peripheral circuit 92 to the region over the spacer 94. The spacer 94 may be formed of the same material as the material for the interconnect 54 which electrically connects the electro-optical element 60 with the peripheral circuit 92. The spacer 94 may be referred to as a dummy interconnect.

In FIG. 9, the entire peripheral circuit 96 is disposed inside the region of the attachment section 90. In this case, a spacer 98 may be formed at a location adjacent to the peripheral circuit 96, and the attachment section 90 may be disposed over the peripheral circuit 96 and the spacer 98. The effect of this modification is the same as the effect of the modification shown in FIG. 8.

The attachment section 90 of the sealing member 84 for the substrate 10 (covering section 80, for example) may be disposed so as to avoid (so as not to come in contact with) the side interconnect 22 or the conductive section 74. In this case, the attachment section 90 of the sealing member 84 may be disposed outside the side interconnect 22 and the conductive section 74 (location at a distance from the operating region 12 or location close to the edge of the substrate 10). This enables the sealing member 84 to be reliably secured to the substrate 10 (covering section 80, for example) by using an adhesive 86, even in the case where at least the surface of the side interconnect 22 or the conductive section 74 is formed of a material having poor adhesion to the adhesive 86 (metal, for example). The covering section 80 may have higher adhesion to the adhesive 86 than that of a metal.

In the present embodiment, the common interconnects 30, 32, and 34 are formed outside the side interconnect 22 (location at a distance from the operating region 12 or location close to the edge of the substrate 10). Therefore, the attachment section 90 of the sealing member 84 can be allowed to overlap at least a part of the common interconnects 30, 32, and 34. This enables the size of the sealing member 84 to be reduced, whereby the size of the electro-optical device 1 can be reduced. The attachment section 90 of the sealing member 84 may be located over at least a part of the spacer 82 and at least a part of the common interconnects 30, 32, and 34. According to this feature, since the attachment section 90 of the sealing member 84 is disposed on the surface of the covering layer 80 in the region in which the degree of inclination or unevenness is small (flat region, for example), the attachment section 90 can be attached securely.

Figure 10:
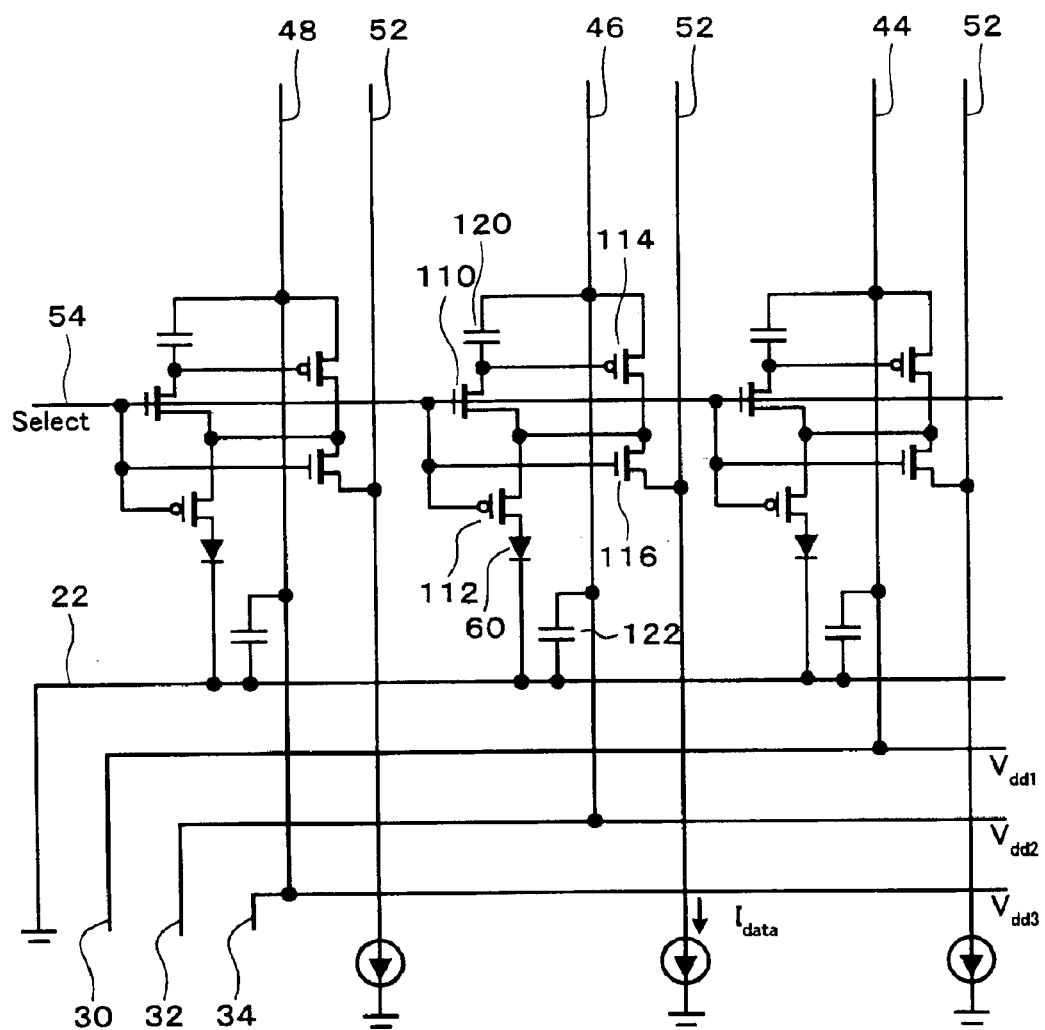
FIG. 10 is a circuit diagram illustrating the operation of an electro-optical device according to an embodiment of the present invention.

FIG. 10 is a circuit diagram illustrating the operation of the electro-optical device according to the present embodiment. The electro-optical device 1 includes elements corresponding to the circuit shown in FIG. 10. The circuit configuration (element connection state) is as shown in FIG. 10. Description of the circuit configuration is omitted. In the present embodiment, the side interconnect 22 is connected to a low potential (ground potential, for example), and the common interconnects 30, 32, and 34 are connected to potentials higher than that of the side interconnect 22. Different voltages $V_{dd1}$, $V_{dd2}$, and $V_{dd3}$ are respectively supplied to the common interconnects 30, 32, and 34. The voltages $V_{dd1}$, $V_{dd2}$, and $V_{dd3}$ are voltages corresponding to the luminous efficiency of the light-emitting layers 62. A current $I_{data}$ flows through the interconnect (data line) 52. The current $I_{data}$ is a signal corresponding to a current supplied to the electro-optical element 60. A select signal is input to the interconnect (scanning line) 54. The select signal is either an H signal at a high potential or an L signal at a low potential. The operation of one unit circuit including the electro-optical element 60 is described below.

In a programming period, the voltage $V_{dd2}$ is supplied to the interconnect 46, whereby the current $I_{data}$ flows through the interconnect 52. In the programming period, the H signal is input to the interconnect 54, whereby switching elements 110 and 116 are turned ON and a switching element 112 is turned OFF. When the current $I_{data}$ flows through the interconnect 52 from the interconnect 46 through the switching elements 114 and 116, a control voltage of the switching element 114 (gate voltage in the case where the switching element 114 is a MOS transistor) becomes a value corresponding to the current $I_{data}$, and a charge corresponding to the control voltage is stored in a capacitor 120.

In an operation period (light-emitting period, for example), the L signal is input to the interconnect 54, whereby the switching elements 110 and 116 are turned OFF and the switching element 112 is turned ON. The switching element 114 is controlled (turned ON, for example) by the control voltage (gate voltage in the case where the switching element 114 is a MOS transistor) corresponding to the charge stored in the capacitor 120 in the programming period, whereby a current corresponding to the control voltage flows through the electro-optical element 60 from the interconnect 46 through the switching elements 114 and 112.

The above-described elements are provided for each of the electro-optical elements 60. The switching elements 110, 112, 114, and 116 and the like may be formed by using a poly-silicon thin film or the like. In the present embodiment, the capacitors 122 are formed by the side interconnect (cathode interconnect, for example) 22, the interconnects 44, 46, and 48 electrically connected with the common interconnects (anode interconnects, for example) 30, 32, and 34, and the insulators provided therebetween. Therefore, a rapid voltage drop of the common interconnects (anode interconnects, for example) 30, 32, and 34 can be prevented.

In a method of manufacturing the electro-optical device according to the present embodiment, the electro-optical elements 60 are formed in the operating region 12 of the substrate 10. At least one peripheral circuit 14 including the active element 88 is formed adjacent to the operating region 12 of the substrate 10. The sealing member 84 which seals the electro-optical elements 60 is attached to the substrate 10 so that the attachment section 90 of the sealing member 84 overlaps the peripheral circuit 14. According to the present embodiment, since the attachment section 90 of the sealing member 84 is allowed to overlap the peripheral circuit 14, the size of the device can be reduced. The term "overlap" means that at least a part of the attachment section 90 overlaps at least a part of the peripheral circuit 14.

Figure 11:
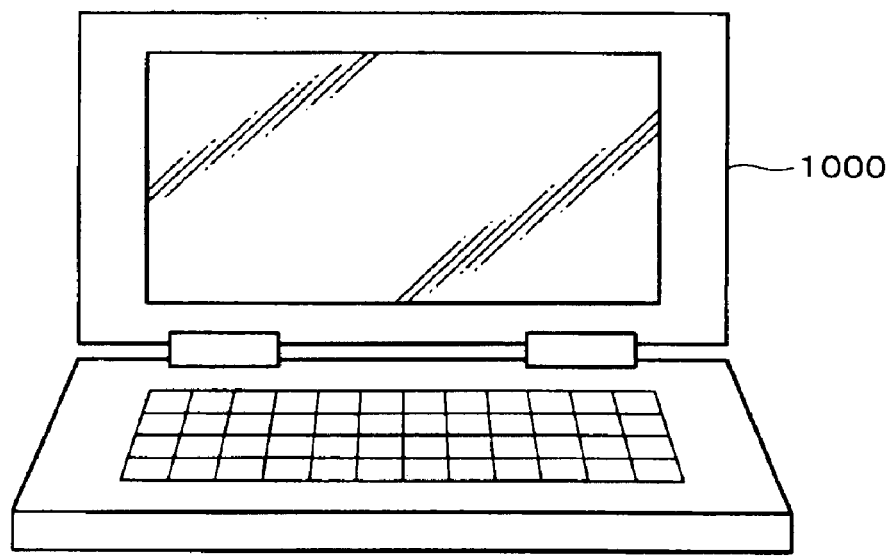
FIG. 11 shows an electronic instrument according to an embodiment of the present invention.
Figure 12:
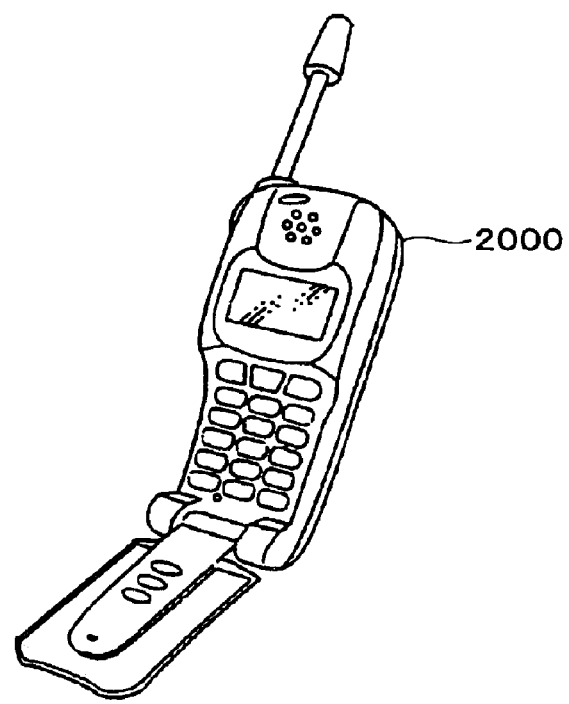
FIG. 12 shows another electronic instrument according to an embodiment of the present invention.

FIGS. 11 and 12 respectively show a notebook-type personal computer 1000 and a portable telephone 2000 as examples of electronic instruments including the electro-optical device according to the embodiment of the present invention.

The present invention is not limited to the above-described embodiments. Various modifications and variations are possible. For example, the present invention includes configurations essentially the same as the configurations described in the embodiments (for example, configurations having the same function, method, and results, or configurations having the same object and results). The present invention includes configurations in which any unessential part of the configuration described in the embodiments is replaced. The present invention includes configurations having the same effects or achieving the same object as the configurations described in the embodiments. The present invention includes configurations in which conventional technology is added to the configurations described in the embodiments.

What is claimed is:

1. An electro-optical device comprising:
   a substrate;
   a plurality of unit circuits formed in an operating region of the substrate corresponding to intersecting regions of a plurality of scanning lines and a plurality of data lines, each of the unit circuits including an electro-optical element;
   at least one peripheral circuit which includes an active element and is formed adjacent to the operating region; and
   a sealing member which seals the electro-optical elements and includes an attachment section to the substrate, the attachment section being located to overlap the peripheral circuit,
   wherein the peripheral circuit is one of a scanning line driver circuit, a test circuit and a precharge circuit, the scanning line driver circuit supplying a scanning signal to the unit circuits through the scanning lines, the test circuit testing the unit circuits to determine whether or not each of the unit circuits is defective, and the precharge circuit outputting a precharge signal to the data lines.

2. The electro-optical device as defined in claim 1, further comprising:
   a spacer provided adjacent to the peripheral circuit,
   wherein the attachment section is located over the peripheral circuit and the spacer.

3. The electro-optical device as defined in claim 2,
   wherein the spacer is formed of the same material as a material for an interconnect which electrically connects the electro-optical element with the peripheral circuit.

4. The electro-optical device as defined in claim 1,
   wherein the electro-optical element includes one of a plurality of light-emitting layers of different emission colors.

5. The electro-optical device as defined in claim 2,
   wherein the electro-optical element includes one of a plurality of light-emitting layers of different emission colors.

6. The electro-optical device as defined in claim 3,
   wherein the electro-optical element includes one of a plurality of light-emitting layers of different emission colors.

7. An electronic instrument comprising the electro-optical device as defined in claim 1.

8. An electronic instrument comprising the electro-optical device as defined in claim 2.

9. An electronic instrument comprising the electro-optical device as defined in claim 3.

10. An electronic instrument comprising the electro-optical device as defined in claim 4.

11. An electronic instrument comprising the electro-optical device as defined in claim 5.

12. An electronic instrument comprising the electro-optical device as defined in claim 6.

13. A method of manufacturing an electro-optical device comprising:
    forming a plurality of unit circuits in an operating region of a substrate corresponding to intersecting regions of a plurality of scanning lines and a plurality of data lines, each of the unit circuits including an electro-optical element;

forming at least one peripheral circuit adjacent to the operating region, the peripheral circuit including an active element; and attaching a sealing member to the substrate so that an attachment section of the sealing member overlaps the peripheral circuit, the sealing member sealing the electro-optical elements, wherein the peripheral circuit is one of a scanning line driver circuit, a test circuit and a precharge circuit, the scanning line driver circuit supplying a scanning signal to the unit circuits through the scanning lines, the test circuit testing the unit circuits to determine whether or not each of the unit circuits is defective, and the precharge circuit outputting a precharge signal to the data lines.

* * * * *